United States Patent [19]

Solomon

[11] Patent Number: 4,965,645
[45] Date of Patent: Oct. 23, 1990

[54] SATURABLE CHARGE FET

[75] Inventor: Paul M. Solomon, Yorktown Heights, N.Y.

[73] Assignee: International Business Machines Corp., Armonk, N.Y.

[21] Appl. No.: 28,640

[22] Filed: Mar. 20, 1987

[51] Int. Cl.$^5$ ............................................. H01L 29/80
[52] U.S. Cl. ........................................ 357/22; 357/16; 357/58
[58] Field of Search ............ 357/16, 22, 22.4, 22 MO, 357/58, 56

[56] References Cited

U.S. PATENT DOCUMENTS

| 4,442,445 | 4/1984 | Malik et al. | 357/58 |
| 4,583,105 | 4/1986 | Rosenberg | 357/22.A |
| 4,590,502 | 5/1986 | Morkol | 357/16 |
| 4,593,301 | 6/1986 | Inata et al. | 357/16 |
| 4,605,945 | 8/1986 | Katayama et al. | 357/16 |
| 4,663,643 | 5/1987 | Mimura | 357/16 |
| 4,672,406 | 6/1987 | Sawada et al. | 357/16 |
| 4,673,959 | 6/1987 | Shiraki et al. | 357/16 |

FOREIGN PATENT DOCUMENTS

| 59-210673 | 11/1984 | Japan | 357/22 MO |
| 60-28273 | 2/1985 | Japan | 357/22 MO |
| 60-117680 | 6/1985 | Japan | 357/22 MO |
| 60-193382 | 10/1985 | Japan | 357/22 MO |

OTHER PUBLICATIONS

T. Zipperian et al., "A GaAs/InGaAs/GaAs... FET," Inst. Phys. Conf. Ser. No. 79, Ch. 8, Int. Symp. GaAs and Related Compounds, Karuizawa, Japan 1985, pp. 421-425.

P. M. Solomon, et al., "A GaAs Gate Heterojunction FET", IEEE Electron Device Letters, vol. EDL-5, No. 9, Sep. 1984.

H. Kinoshita, et al., "A New Insulated Gate Inverted Structure Modulation Doped AlGaAs/GaAs/N-AlGaAs FET", Jap. J. App. Phys., vol. 23, p. L836, 1924.

M. Ogura, et al., "Self Aligned Enhancement Mode FET with AlGaAs as Gate Insulator", Journal of Vacuum Science & Technology B, vol. 3, p. 581, 1985.

Primary Examiner—Rolf Hille
Assistant Examiner—Steven Loke
Attorney, Agent, or Firm—Scully, Scott, Murphy & Presser

[57] ABSTRACT

A new gallium arsenide gate heterojunction FET is disclosed. The gate is a multi-layer structure including an intermediate carrier depletable layer. Upon applying a gate voltage, the intermediate layer becomes depleted thereby effectively increasing the gate resistance and reducing gate leakage current.

18 Claims, 1 Drawing Sheet

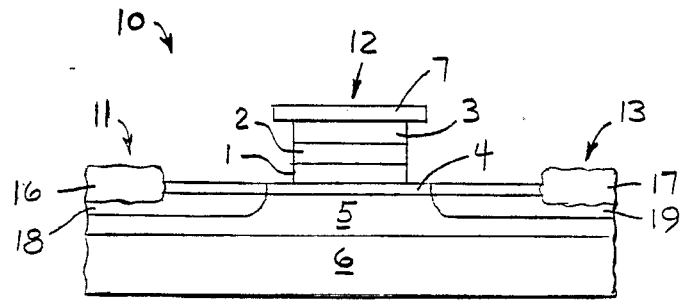
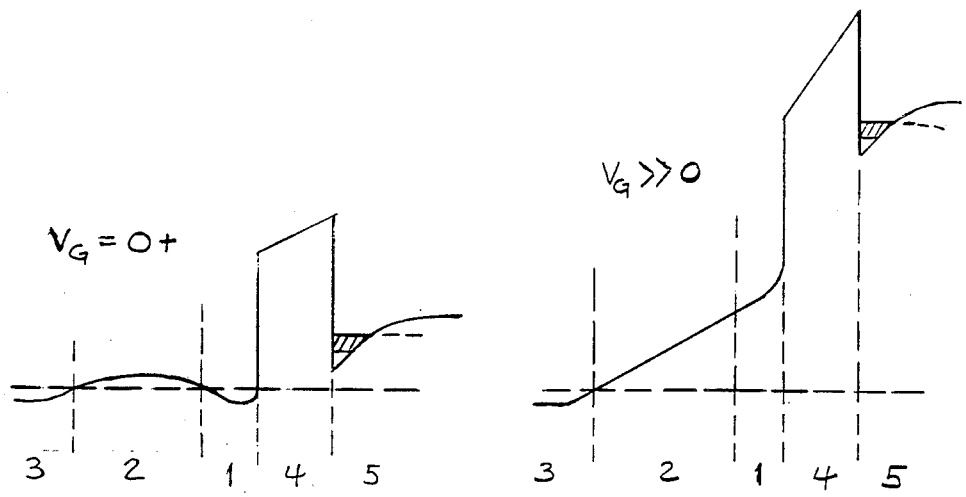
FIG. 1
FIG. 2
FIG. 3

SATURABLE CHARGE FET

BACKGROUND

This invention relates in general to semiconductor devices, and, in particular, to an improved saturable charge gallium arsenide gate field effect transistor.

A semiconductor-insulator-semiconductor field-effect transistor with a gallium arsenide gate is described in, "A GaAs Gate Heterojunction FET", P. M. Solomon, et al., IEEE Electron Device Letters, Volume EDL-5, No. 9, September 1984. That transistor has a heavily doped. n-type gallium arsenide gate with an undoped aluminum gallium arsenide gate insulator disposed on an undoped gallium arsenide layer. Sources and drains are fabricated from n-doped, ion-implants. Compared to a silicon based MOSFET, the gallium arsenide gate FET has a lower threshold voltage, a higher speed of operation due to an extraordinary electron mobility at low temperatures, and a low power supply voltage requirement.

However, the relatively low gate voltage has certain drawbacks. In particular, the low gate voltage results in an appreciable gate leakage current. The leakage current is particularly significant in low power dissipation circuits such as complimentary and memory cells. In such cells, it is desirable to have very thin insulating layers of aluminum gallium arsenide in order to yield a higher transconductance. It is also desirable to operate devices with larger gate voltages. In both cases, the thinner layer of aluminum gallium arsenide and the increased operating voltage on the gate increases the undesired leakage current.

So, it is desirable to have an FET as described above with a gate structure that operates at higher voltages and has less leakage current. It is particularly desirable to have such a device without any compromise in the speed or performance of the GaAs gate FET.

SUMMARY OF THE INVENTION

The foregoing desired objects are achieved by an FET with a multi-layer gate structure. In particular, an FET with a gallium arsenide gate is constructed with three layers of gallium arsenide. The bottom layer or layer closest to the aluminum gallium arsenide insulating layer is a layer of highly doped gallium arsenide. The next or intermediate layer is a layer of relatively lightly doped gallium arsenide. The upper or top most, ohmic contact layer is a layer of highly doped gallium arsenide. In all layers the doping is the same type i.e. it is all n-doped or all p-doped. In the preferred embodiment the doping is all n-doped with the intermediate layer less doped than either the bottom or the top layer.

The alternate layers of gallium arsenide are applied to the gate by suitable means, such as molecular beam epitaxial deposition. The charge carrier type of doping of the layers is the same as the doping of the channel of the FET. The device operates on the principle that the charge density in the FET channel and the gate current depend upon the electric field in the insulating layer of aluminum gallium arsenide. By limiting the electric field at a given voltage, for instance, by choosing a thick enough insulator, both the gate current and the charge density in the channel will be limited.

The invention achieves this end by interposing a depletion layer i.e. the lightly doped, intermediate gallium arsenide layer between the two heavily doped gallium arsenide layers in the gate. As such, the intermediate layer, under the influence of a large gate voltage, becomes depleted of charge carriers. When depletion occurs, the intermediate layer becomes an insulator that is in series with the aluminum gallium arsenide insulating layer. So, the effective insulating layer on the gate is dynamically increased as the result of increasing gate voltage.

For low gate voltages, the bottom layer on the gate is only partially depleted and the FET is conductive and thus has a high transconductance However, for large gate voltages, the bottom layer of the gate becomes completely depleted of charge carriers The second layer or intermediate layer also becomes depleted and so the concentration of electrons in the channel underneath the gallium arsenide layer saturates at the value of sheet donor concentration of electrons in the bottom most gallium arsenide layer of the gate. A further increase in gate voltage will cause only a small or negligable increase in drain or gate current. In effect, the thickness of the gate insulator is now that of the depleted intermediate region in series with the aluminum gallium arsenide layer.

DESCRIPTION OF THE DRAWING

The foregoing summary of the invention can be better understood by reference to the following detailed description when read in conjunction with the accompanying drawing wherein:

FIG. 1 is a cross-sectional schematic view of the invention;

FIG. 2 is an energy band diagram of the cross-section of the invention for low gate voltages slightly greater than zero;

FIG. 3 is an energy band diagram of the invention for relatively large gate voltages.

DETAILED DESCRIPTION

In FIG. 1 there is generally shown a saturable charge FET 10. The structure of the FET 10 has a (100)-oriented semi-insulating gallium arsenide substrate 6. On top of layer 6 is a layer 5 of undoped, gallium arsenide. Layer 5 is approximately one micron thick and is grown by molecular beam epitaxial methods. On top of layer 5 is layer 4 comprising a layer of undoped $Al_xGa_{1-x}As$ also grown by molecular beam epitaxy. Layer 4 may be from 10nm to 100nm thick and the preferred thickness is approximately 20nm. The range of x in the $Al_xGa_{1-x}As$ layer 4 is between 0.3 and 0.8, preferably 0.5. Source and drain regions 18, 19 may be formed by ion implantation or diffusing of n-type doping It is preferred to implant silicon at 60 KeV and $5 \times 10^{13} cm^{-3}$. Ohmic contacts 16, 17 are fabricated in a customary manner using a gold-germanium nickel alloy or other suitable contact components.

The gate of the FET 10 includes a bottom layer 1 adjacent the barrier or insulating layer 4. Layer 1 comprises a layer of gallium arsenide that is about 100 Angstroms thick and n-doped to approximately $10^{18} cm^{-3}$. The doping times the thickness of layer 1 is equal to the maximum charge density desired in the FET channel. The doping in layer 1 is large enough to not appreciably degrade the transconductance of the FET. The preferred range of area charge densisty is $5 \times 10^{11} cm^{-2}$ to $2 \times 10^{12} cm^{-2}$ for layer 1. Layer 2 is aiso composed of GaAs and is doped to a much lesser degree than is layer 1; about $10^{16} cm^{-3}$ is typical. Layer 2 is limited in thickness by the planarity constraints on the FET 10. Otherwise, layer 2 can be as thick as practically possible and 0.2nm is typical. Layer 3 is also composed of GaAs which is doped as heavily as possible and is thick enough to ensure a good contact with ohmic contact 7. Doping in the order $6 \times 10^{18}$ cm$-3$ is typical and a thickness of 500 Angstroms would be desirable. An additional layer (not shown) of indium arsenide may be deposited on layer 3 to assist in the further fabrication of ohmic contact with layer 3.

A 150nm layer of a refractory metal such as molybdenum or tungstem silicide is deposited to form the contact layer 7. That layer is using reactive ion etching and plasma to expose the upper surface of the aluminum gallium arsenide layer 4. formation of the source and drain regions noted above, the device 10 is annealed and ohmic contacts 16, 17 are formed. The device 10 has a gate length of 1 micron or as small as photolithography permit.

In operation, the threshold voltage of the device 10 is near zero. A heterojunction forms in the device between the aluminum gallium arsenide layer 4 and the gallium arsenide layer 5. There is a two dimensional electron gas at that interface. As such, carriers appearing at the source are rapidly transmitted via of the two dimensional gas to the drain. This typical operation of the device 10 is diagramically presented in FIG. 2. For low gate voltages, the layer 1 is only partially depleted and layer 2 has no influence on the characteristics of device 10 since it is essentially a conducting layer.

When the gate voltage is increased the affects of the increased voltage upon the gate layers 1, 2, 3 produces a pronounced change in the operation of the device 10. In this regard, references made to FIG. 3. There it is shown that for a large gate voltage layer 1 will become depleted. For a sufficiently lightly doped layer 2, it too will become depleted. As such, the electron concentration in the channel underneath the gate 12 and between the source region 18 and the drain region 19 saturates at the value of sheet donor concentration in layer 1. By Gauss' law, the electric field in aluminum gallium arsenide layer 4 is fixed at a value determined by the donor sheet concentration in layer 1, and the gate tunneling current is fixed. A further increase in gate voltage will cause a small increase in drain and gate current. This is so b the effective thickness of the insulating layers of 12 is now that of the depleted region 2 in series with aluminum gallium arsenide layer 4. The sum of these two regions may be between 300 to 2,000 Angstroms thick. Such thickness will be sufficient for adequately reducing gate leakage current at larger gate voltages.

In the foregoing description, the FET 10, is an n-channel device. However, those skilled in the art will appreciate that different types of doping concentrations as well as different layers and other materials may also be used, e.g, p-channel devices could be fabricated with suitable doping. Also, the layers 1, 2, 3 are deposited on the gate by well known methods of molecular epitaxial deposition but other methods are usable. So, various modifications, substitutions, additions, and deletions may be made without departing from the spirit and scope of the invention as is defined the appended claims.

I claim:

1. A field effect transistor comprising:
   source and drain electrodes separated by a channel region and a barrier layer on a semiconductor substrate; and
   a semiconductor gate in proximity to the barrier layer, said gate having a first high conductivity semiconductor a layer immediately adjacent said barrier layer, and a second depletable low conductivity semiconductor layer separating said first layer from a third high conductivity semiconductor external contact layer.

2. The invention of claim 1 wherein the three gate layers are doped and the second layer is doped less than the other two layers.

3. The invention of claim 1 wherein the three gate layer comprises the same semiconductor material.

4. The invention of claim 3 wherein the material is GaAs.

5. The invention of claim 1 wherein the three layers comprise GaAs and the second layer is doped less than the other two layers in order to form a depletion layer under the influence of a predetermined voltage applied to the gate.

6. The invention of claim 1 wherein the second layer is of the order of 300°A to 1 micron thick.

7. The invention of claim 1 wherein the three gate layers have the same type of conductivity.

8. The invention of claim 1 wherein the product of the doping and the thickness of the layer is equal to a maximum desired charge density in the channel 9. The invention of claim 1 wherein the preferred range of area charge density of the first layer is $5 \times 10^{11}$cm$^{-2}$ to $2 \times 10^{12}$cm$^{-2}$.

10. The invention of claim 1 wherein the second layer becomes depleted of charge carriers upon application of a predetermined voltage to said gate.

11. A field effect transistor comprising:
    a semiconductor substrate;
    an barrier layer disposed on said substrate;
    source and drain electrodes disposed in said substrate and being spaced from each other, a channel region being defined between said source and drain electrodes adjacent said barrier layer; and
    a semiconductor gate disposed on said barrier layer between said source and drain electrodes, said gate having a first high conductivity semiconductor layer immediately adjacent said barrier layer and a second low conductivity semiconductor layer separating said first layer from a third high conductivity semiconductor layer.

12. The field effect transistor of claim 11 wherein the first, second and third semiconductor layers comprises the same semiconductor material.

13. The field effect transistor of claim 12 wherein the semiconductor material is GaAs.

14. The field effect transistor of claim 13 wherein the barrier layer comprises undoped AlGaAs.

15. The field effect transistor of claim 14 wherein the second semiconductor layer is doped less than the first and third semiconductor layers such that the second layer forms a depletion layer upon the application of a predetermined voltage applied to the gate above a threshold voltage, said second layer being conductive below said predetermined voltage.

16. The field effect transistor of claim 15 wherein the second gate layer has a thickness such that under the influence of a predetermined voltage applied to the gate the channel electron concentration saturates at the value of sheet doner concentration in the first gate layer.

17. The field effect transistor of claim 16 wherein the product of the doping and the thickness of the first gate layer is equal to a maximum desired charge density in the channel.

18. The field effect transistor of claim 17 wherein an ohmic contact is deposited on the third gate layer.

* * * * *